United States Patent [19]
Cresswell et al.

[11] Patent Number: 5,684,301
[45] Date of Patent: Nov. 4, 1997

[54] MONOCRYSTALLINE TEST STRUCTURES, AND USE FOR CALIBRATING INSTRUMENTS

[75] Inventors: Michael W. Cresswell, Frederick; R. N. Ghoshtagore, Ellicott City; Loren W. Linholm, Ijamsville; Richard A. Allen, Germantown, all of Md.; Jeffry J. Sniegowski, Albuquerque, N. Mex.

[73] Assignee: The United States of America as represented by the Secretary of Commerce, Washington, D.C.

[21] Appl. No.: 409,467

[22] Filed: Mar. 23, 1995

Related U.S. Application Data

[63] Continuation-in-part of Ser. No. 382,973, Feb. 3, 1995, Pat. No. 5,617,340, which is a continuation-in-part of Ser. No. 236,202, Apr. 28, 1994, Pat. No. 5,602,492.

[51] Int. Cl.⁶ .................................................. G01R 31/26
[52] U.S. Cl. ........................ 250/306; 257/48; 324/158 R
[58] Field of Search ............................ 250/306; 257/48; 324/158.1

[56] References Cited

U.S. PATENT DOCUMENTS

| | | | |
|---|---|---|---|
| 5,021,364 | 6/1991 | Akamine et al. | 437/228 |
| 5,201,992 | 4/1993 | Marcus et al. | 156/643 |
| 5,235,187 | 8/1993 | Arney et al. | 250/306 |
| 5,254,696 | 10/1993 | Toda | 250/306 |
| 5,302,239 | 4/1994 | Roe et al. | 156/643 |
| 5,449,903 | 9/1995 | Arney et al. | 250/306 |
| 5,461,907 | 10/1995 | Tench et al. | 73/105 |
| 5,475,318 | 12/1995 | Marcus et al. | 324/762 |
| 5,478,698 | 12/1995 | Rostoker et al. | 430/296 |
| 5,485,080 | 1/1996 | Larrabee et al. | 324/158.1 |

OTHER PUBLICATIONS

Allen et al., "A New Test Structure . . .", IEEE Electron Device Letters, vol. 13, No. 6, pp.322–323, Jun. 1992.

Nagase et al, "Metrology of Atomic Force Microscopy for Si Nano–Structures", *Jpn.J. Appl. Phys.*, vol. 34, 1995 pp. 3382–3387, Part 1, No. 6B, Jun. 1995.

*Primary Examiner*—Jack I. Berman
*Attorney, Agent, or Firm*—Michael De Angeli

[57] ABSTRACT

An improved test structure for measurement of width of conductive lines formed on substrates as performed in semiconductor fabrication, and for calibrating instruments for such measurements, is formed from a monocrystalline starting material, having an insulative layer formed beneath its surface by ion implantation or the equivalent, leaving a monocrystalline layer on the surface. The monocrystalline surface layer is then processed by preferential etching to accurately define components of the test structure. The substrate can be removed from the rear side of the insulative layer to form a transparent window, such that the test structure can be inspected by transmissive-optical techniques. Measurements made using electrical and optical techniques can be correlated with other measurements, including measurements made using scanning probe microscopy.

10 Claims, 3 Drawing Sheets

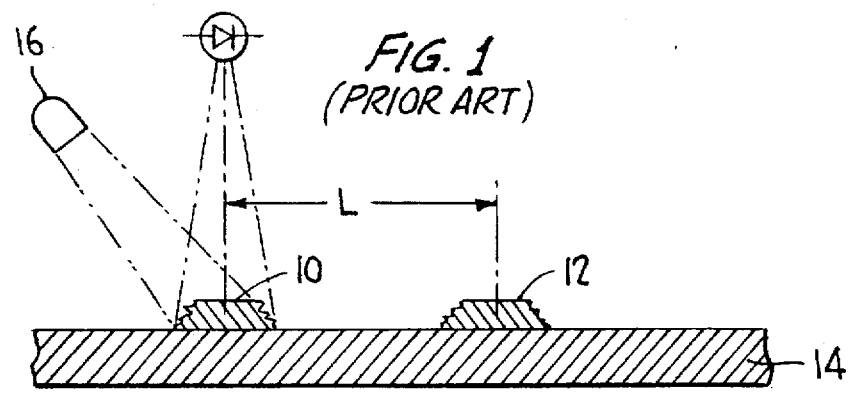
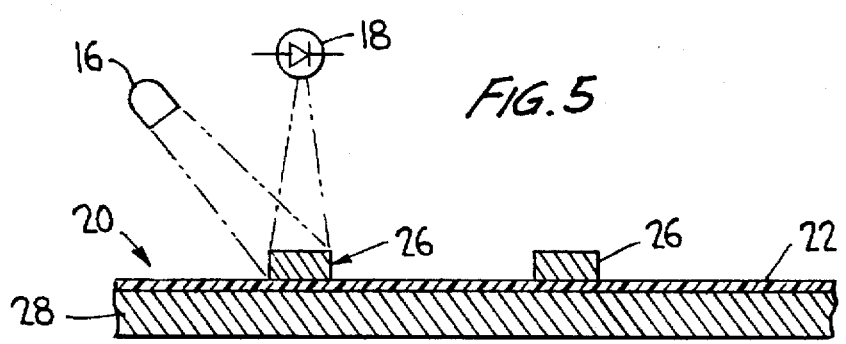
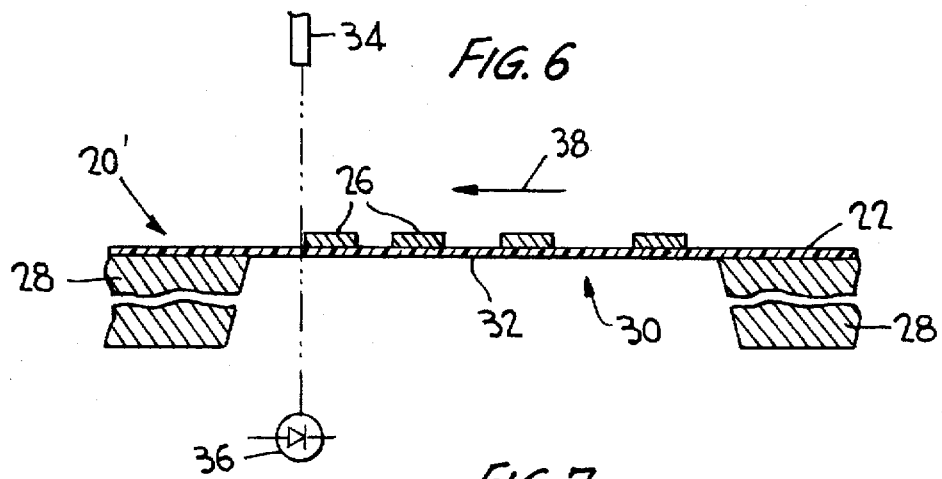
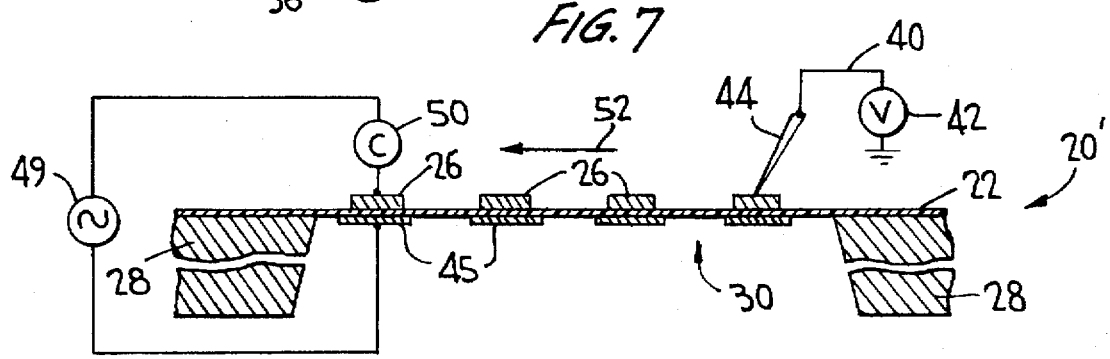

MONOCRYSTALLINE TEST STRUCTURES, AND USE FOR CALIBRATING INSTRUMENTS

CROSS REFERENCE TO RELATED APPLICATIONS

This application is a continuation-in-part of U.S. patent application Ser. No. 08/382,973 filed Feb. 3, 1995, now U.S. Pat. No. 5,617,340, which is a continuation-in-part of U.S. patent application Ser. No. 08/236,202, filed Apr. 28, 1994, now U.S. Pat. No. 5,602,492.

FIELD OF THE INVENTION

This invention relates to an improved test structure and fabrication technique thereof, and methods for using the improved test structure for calibrating different types of instruments used to measure the width, spacing, or like geometrical characteristics of conductive features or comparable patterned elements, e.g., as formed during semiconductor manufacturing operations.

BACKGROUND OF THE INVENTION

As improvements in semiconductor manufacturing technology continue to reduce the size of features formed on substrates in manufacture of integrated circuits and the like, demands on the dimensional metrology used to evaluate the accuracy of manufacturing processes and the like increase concomitantly. There is a particular need for test structures and methods for calibrating various types of instruments used for measuring the widths and spacing of conductors formed on substrates, and like geometrical characteristics of similar structures.

More particularly, in parent application Ser. No. 08/382, 973, the problem of measuring the distance between two parallel conductors is addressed in detail. Distances between spaced conductors, and the widths of such conductors, are commonly measured using an imaging instrument, such as an optical microscope or an electron microscope, detecting radiation reflected by the element to be imaged. In some cases, these instruments may detect radiation transmitted through a radiation-transparent substrate on which the feature is formed.

In many cases of interest, such features are formed by photolithographic selective removal processes. Where the features are to be conductive, such processes essentially involve the steps of forming a continuous thin layer of conductive metal or the like over a substrate, covering the metal layer with a photoresist mask patterned to define areas of the metal layer which are to remain, exposing this assembly to an etchant which removes the metal not protected by the photoresist mask, and then removing the mask, so that only the patterned areas of the metal remain of the original continuous layer.

Ideally, conductors and like features formed on a substrate using such selective removal processes would exhibit rectangular cross-sectional shapes. That is, the side walls of the conductors would rise at right angles from the substrate to meet the top of the remaining planar upper surface of the layer of conductive material at another right angle. In practice, the side walls of the conductors tend to exhibit irregular side wall angles due to, for example, under-cutting, local variations in the etch rate, and the like. These irregularities in formation of the side walls render the width of the conductor somewhat variable.

It is difficult to evaluate the width of a conductor or the spacing of two conductors having such irregular side walls using an imaging instrument, for example, an optical microscope, where radiation reflected from or transmitted past the structure is to be detected. Again, under ideal circumstances, light would be reflected as if from a mirror from the flat upper surface of the patterned conductive feature to be imaged, and would be reflected in a differing manner from the angled side walls of the feature, enabling the "corners" of the side wall to be optically detected. It would be desirable to provide a method of fabricating a conductor on a substrate wherein the side walls of the conductors were regular and substantially planar, so that the widths and other geometrical characteristics of the conductive members thus formed might be accurately evaluated using an optical or electron microscope.

More specifically, there are disclosed in the parent application several types of test structures for cross-calibrating imaging instruments, such as electron or optical microscopes, with respect to instruments providing electrical measurements of the same test structure. "Electrical measurements", as referred to in the parent application, include measurements made by forcing a current along a conductive member and measuring voltage drops between spaced locations therealong, as well as capacitative, inductive, or impedance measurements of the geometrical characteristics of the conductor.

It would be desirable to provide a similar cross-calibration capability with respect to scanning probe microscopes (SPMs), including in the latter term all types of instruments wherein a tunneling current passes between a probe moved over a conductive object being inspected and the object, the tunneling current varying with juxtaposition of the probe to each individual atomic site of the structure being inspected. Such microscopes are becoming increasingly commonplace for "atomic site counting" as a means of measuring the width of a structure, for example. Accordingly, cross-correlation of an SPM measurement with an electrical measurement, or with an imaging-instrument measurement, would be a very useful tool for calibrating these instruments with respect to one another.

Further improvements to be addressed by the present invention include recognition of the fact that an electrical measurement of "linewidth", i.e., the width of an elongated conductor formed on a substrate, typically provides a value for the average width of the entire conducting line, while a scanning electron microscope (SEM) usually measures linewidth using an algorithm based on a non-electrically-calibrated diffraction grating, while optical and SPM methods provide a "snapshot" of the linewidth at a specific point of measurement. More specifically, optical measurements attempt to provide a measurement of linewidth using two defined points at both edges of an image of the line, followed by analysis of the output signal from an optical detector to calculate the linewidth. Due to the irregularity normally exhibited by the sidewalls of conductors on a substrate, an image of the conductors formed using an optical measurement instrument will exhibit substantial indefiniteness as to the exact location of the edges of the sidewalls of the conductor. Modeling is used to determine where the edges of the line are likely to be. Obviously, it would be preferable to avoid this theoretical step.

The art recognizes generally that these various techniques for measuring the same physical parameter give varying results. To a degree, these are explained by the intrinsic characteristics of the different measuring techniques; these differences are also likely due in part to irregularities in the line being measured. If a test structure exhibiting a better-defined physical structure could be fabricated, very likely many of the cross-correlation errors now acknowledged to exist could effectively be eliminated.

As indicated, it will be recognized that the same problems inherent in measuring linewidth, and specifically in correlating measurements of linewidth made using one measurement technique with comparable measurements made using another technique, exist equally in connection with measurement of other geometrical characteristics of the structure, such as measurement of the spacing between adjacent conductors on a substrate, or of the overlay of different components of a composite structure formed in a succession of patterning steps. Here again, precision test structures would enable better correlation of various types of measurement instruments, as needed to evaluate more demanding production technologies being developed.

OBJECTS OF THE INVENTION

It is therefore an object of the invention to provide an improved test structure allowing regular elongated conductive members to be formed on a substrate, enabling more accurate cross-correlations of measurements of linewidth and line spacing made using imaging instruments, electrical instruments, scanning probe microscopes, and variations thereof.

It is a further object of the invention to provide an improved test structure precursor which can be subsequently patterned to provide a test structure capable of more accurate cross-correlation of measurements made using differing types of test instruments than had heretofore been possible.

It is a further object of the invention to provide improved methods of cross-correlating measurements of geometrical characteristics, e.g., linewidths and line spacings of patterned structures on substrates, in particular wherein the features of the patterned structure are formed more precisely and reproducibly than heretofore possible.

It is a more specific object of the invention to provide a test structure wherein a patterned conductive structure is defined on a transparent insulative layer, the conductive structure having uniform side walls meeting a uniform upper surface at a predetermined angle, such that, for example, the cross-sectional area of the conductor can be readily determined using transmissive optical measurement techniques, and can be cross-correlated to electrical or SPM measurements of the same geometrical characteristic.

SUMMARY OF THE INVENTION

The above needs of the art and objects of the invention, and others appearing below, are met by the present invention, wherein a monocrystalline starting member, such as a silicon wafer having a specified crystal orientation, has an insulating layer formed below its surface. For example, an insulating layer can be formed below the surface of a monocrystalline silicon substrate by the so-called SIMOX process, which stands for "Separation (or, equivalently, Silicon Isolation) by the Implantation of Oxygen". After formation of the insulative layer, the monocrystalline layer on the surface is then patterned using standard photolithographic techniques, and a preferential etchant such as KOH or NaOH is applied thereto to remove the monocrystalline material along the crystal planes, thus delineating a patterned conductor having planar side walls on the insulative layer. The result is a patterned monocrystalline structure having side walls meeting the upper surface at angles defined by the crystallographic orientation, and having regular features suitable for well-defined electrical, SPM, and imaging-instrument measurements of linewidth, line spacing and the like.

As the slopes of the side walls are known, and the planar nature of the walls is a given, electrical testing, e.g., current-forcing techniques, can be performed to certify the spacing of the side walls, that is, the linewidth, thus completely characterizing the structure. Other types of instruments can then be calibrated accordingly. Similar techniques can be used to evaluate other geometrical characteristics of a structure, for example, the spacing of various features, or the overlay of components of features formed in successive fabrication steps.

In a particularly preferred embodiment, the oxygen-implanted silicon insulative layer is annealed to form an amorphous layer of insulative silicon dioxide glass within the substrate, and the substrate material is selectively removed from the opposite side thereof, leaving one or more transparent insulative windows below the structure. Transmissive optical measurements and electrical measurements using capacitative techniques can then be made, for example, of linewidth and line spacing of the features of the structure. Similarly, because preferential etching of the monocrystalline material along crystal planes forms a very accurate structure, "atomic site counting" techniques such as scanning probe microscopy (SPM) may be used to provide yet another measure of the width of the lines, or the spacing of respective lines, for cross-calibration of SPM instruments as well.

BRIEF DESCRIPTION OF THE DRAWINGS

The invention will be better understood if reference is made to the accompanying drawings, in which:

FIG. 1 shows a cross-sectional view through two conductors formed on a substrate according to the prior art, and illustrates a typical method of optical inspection thereof;

FIG. 5 shows a cross-sectional view of conductors formed on a substrate according to the present invention, and a schematic arrangement for their inspection using a reflective optical instrument;

FIG. 6 shows a cross-sectional view of a test structure according to the invention, and a schematic arrangement for their inspection using an optical instrument in a transmissive mode;

FIG. 7 shows a cross-sectional view of a test structure formed according to the invention, and a schematic arrangement for its inspection using capacitative and/or scanning microscopic probe techniques.

DESCRIPTION OF THE PREFERRED EMBODIMENTS

Figure 2:
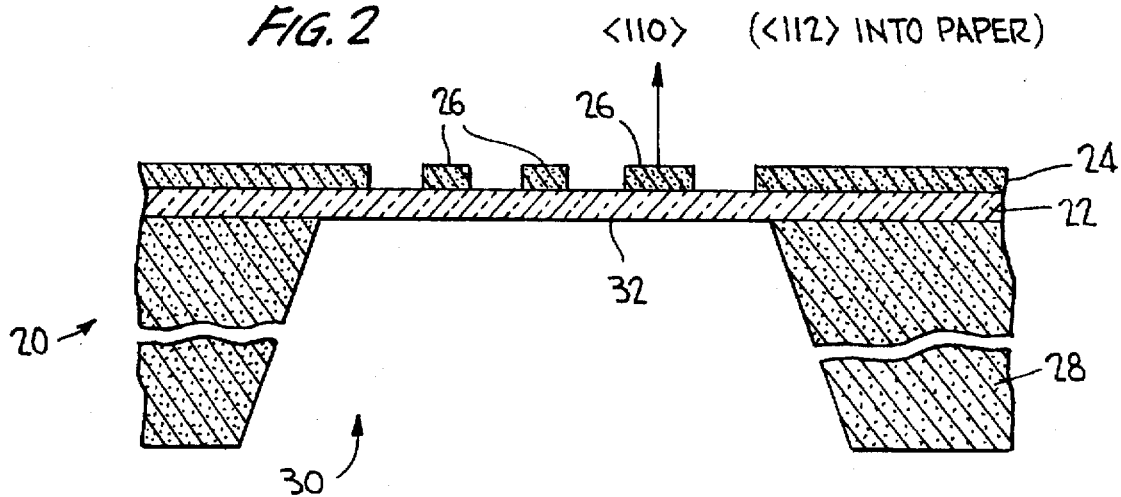
FIG. 2 shows a cross-sectional view through a first embodiment of a test structure formed according to the present invention.

Due to the continued growth in the semiconductor industry over the last forty years, practically all of which has centered on silicon-based transistors, followed by integrated circuits, and later by increasingly large-scale integrated circuits, monocrystalline silicon as used throughout the semiconductor industry is one of the best-characterized materials known to man. In particular, it is well known that certain reagents, notably potassium hydroxide (KOH) and sodium hydroxide (NaOH), preferentially etch monocrystalline silicon along the crystal planes. That is to say, the monocrystalline silicon material when thus processed is etched away precisely along the planes of the crystal structure, such that the etching process can be controlled to remove material along one crystal plane, but not along another crystal plane. More specifically (using notation conventional in the art herein and on the drawings to describe the orientation of the crystal planes of the test structures of the invention), the etching rates for the several crystal orientations bear the relationship (110)>(100)>(111), such that the material oriented along the (111) plane is etched significantly more slowly than material oriented along the other planes.

Preferential etching of monocrystalline materials as a means of delineating structures has been suggested for use in fabrication of various types of structures, notably the "micromachines" which are often hailed as forerunners of a new "nanotechnology". The preferential etching characteristics of silicon (also exhibited by other monocrystalline materials) have also been widely employed in connection with metrology for use by the semiconductor industry. See generally, "Critical dimension measurements by electron and optical beams for the establishment of linewidth standards", Hatsuzawa et al, *Proc. IEEE* 1992 *Int. Conference on Microelectronic Test Structures*, Volume 5, March 1992, pp. 180–184.

Hatsuzawa et al teach the manufacture of artifacts having very precisely defined structures using the preferential etching characteristics of monocrystalline silicon, and suggest use of such structures for comparison of electron and optical beam linewidth measurements, that is, for cross-correlation of linewidth measurements made using these types of imaging instruments. The Hatsuzawa structure is a "deep-comb" structure in which vertical "fins" of material 0.5–1.0 µm wide stand 10–20 µm above the substrate, useful as a diffraction grating for imaging instrument measurements.

However, Hatsuzawa et al does not provide a structure whereby measurements made using optical or electron beam imaging instruments can be correlated with, for example, measurements made using electrical techniques. "Electrical techniques" as used herein include all manner of measurement techniques wherein the structure to be measured must be electrically isolated from the structure on which it is formed. For example, a current may be forced along a conductor and a voltage drop measured between specified points therealong to determine the resistance of the structure; the sheet resistance of the material can then be extracted, and the cross-sectional area of the conductor calculated. Equivalent "electrical techniques" for measuring geometrical characteristics of a conductor include exposing the conductor to an RF or other signal, and measuring the capacitance, impedance, or inductance of the conductor.

To measure a geometrical characteristic of a test structure, such as the linewidth or line spacing, using such electrical techniques, the test structure to be evaluated must be electrically isolated, e.g., by being disposed on an insulative substrate. The structures of Hatsuzawa et al are formed on a continuous silicon substrate, such that all portions thereof are in electrical contact with one another, and thus can not be employed for measurements of this kind. Moreover, although SPM measurements do not require the object being inspected to be electrically isolated from the substrate (or other structure) on which it is formed, the deep comb structure of Hatsuzawa is also not suitable for SPM measurements, which are amenable only for the measurement of linewidths (for example) of relatively low-relief structures.

As discussed above, and as discussed in further detail in the parent and grandparent applications, prior art optical techniques for measuring geometrical characteristics of conductive features, such as the width of conductors formed on a semiconductor substrate, have often involved attempts to define and locate the exact edge of a conductor on a substrate optically. For example, referring to FIG. 1, suppose two conductors 10 and 12 are formed on a substrate 14, and it is desired to measure their spacing L. Using an optical instrument, radiation emitted by a source 16 is reflected from the conductors 10 and 12 and detected by a detector 18. The spacing L is typically measured by locating the optical instrument over the apparent center line of one of the conductors 10, and using a lead screw device or the like to move the optical instrument until the center line of the other conductor 12 is similarly apparently aligned, thus measuring the distance.

As noted, in ordinary conductor formation processes, the side walls of the conductors 10 and 12 are somewhat irregularly trapezoidal, preventing precise location of the center lines of the conductors 10 and 12 using reflected optical techniques, because the light reflected from the side walls thereof contributes in an irregular and unpredictable fashion to the total light detected. Accordingly, this process is inherently inaccurate. It was in order to solve this problem, of course, that Hatsuzawa et al proposed preferentially etching monocrystalline silicon material, so as to provide essentially vertical walls in the structure being measured; this enables better optical measurements of the spacing L of adjacent conductors 10 and 12 and similarly better measurements of the width of individual conductors.

However, as noted, because the elements being measured are conductive, and are formed on a conductive substrate, it is not possible to make corresponding electrical measurements of the Hatsuzawa structure. Accordingly, Hatsuzawa's structure does not permit electrical measurements to be made and compared to optical measurements, and cannot be used to calibrate preexisting optical measuring instruments by reference to electrical measurements of the width of the same test structure, as would be desired. Similarly, as noted above, Hatsuzawa's structure comprises comparatively deep "fins", e.g., 10–20 µm high by 0.5–1.0 µm wide, for use as a diffraction grating, and is not suitable for SPM measurements, which are possible only with relatively low-relief structures.

More specifically, a test structure is needed having a geometrical characteristic which can be certified by a metrological standards organization, such as the assignee of this application, using, for example, an electrical or SPM technique. Such a certified test structure could then be supplied to users of preexisting imaging instruments, to enable calibration of the latter.

FIG. 2 shows a structure according to the invention which addresses these deficiencies of the art and meets a number of the objects of the invention as listed above. In FIG. 2, a test structure 20 comprises an insulative layer 22. On top of the insulative layer 22 are formed a number of individual elongated conductive members 26 formed by processing a monocrystalline layer 24 to remove material preferentially along the planes of the crystal. In the embodiment shown, the insulative layer 22 and the patterned conductors 26 are formed on a substrate 28, although substrate 28 is not required in every embodiment of the invention.

In the preferred embodiment of the invention, the test structure 20 is formed of a monocrystalline silicon wafer. A suitable wafer has an insulative layer 22 formed at a controllable distance below the surface of the wafer by a known process such as implantation of oxygen ions, followed by annealing. This process, well known and referred to as SIMOX in the art, essentially forms an insulative layer 22 of amorphous silicon dioxide, that is, glass, beneath the surface of the wafer, such that a monocrystalline layer 24 remains on the surface of the wafer. An alternative but presently less-preferred process is referred to as BESOI, "Bonded and Etched-Back Silicon on Insulator". Insulative layer 22 and monocrystalline layer 24 are both on the order of 200 nm thick. Additional monocrystalline material may be added by epitaxial deposition, if needed.

The monocrystalline surface layer 24 is then processed using known techniques to form the patterned test structure 26 desired. In a simplified version of a typical processing sequence, the surface layer is first provided with a silicon nitride coating, which is then coated with a photoresist material, which in turn is exposed to light in a mask corresponding to the desired pattern and appropriately oriented with respect to the crystalline orientation of the wafer. The resist is then developed and the "hard mask" of silicon nitride is removed by plasma etching, exposing unwanted components of the monocrystalline surface layer 24, which are then etched away using a preferential etchant such as KOH or NaOH. Other etching processes, in particular, reactive ion etching, and additional patterning operations may be performed as necessary. As is known to the art, such processes preferentially etch the monocrystalline layer 24 along the crystalline planes of the material, such that the side walls of the patterned conductive layer 26 meet the substrate and the upper surface thereof at known angles, depending on the orientation of the monocrystalline material.

In an important preferred embodiment of the invention, one or more portions of the silicon substrate 28 are removed as indicated at 30, leaving transparent glass windows 32 beneath the patterned conductors 26. This structure is useful as indicated in FIG. 6 for transmissive-light inspection of the patterned conductors 26. Specifically, a light source 34, such as a laser, is directed at the test structure 20 from one side, and a detector 36 is positioned on the other side. Light from the light source 34 passes through the transparent window 32 but is reflected or scattered from the patterned conductors 26; accordingly, if the test structure 20 is moved with respect to the light source 34, as indicated by arrow 38, the signal from detector 36 provides a direct indication of the width of the patterned conductors 26, and also, of course, of their spacing.

The test structure of the invention is also suitable for reflected-light inspection as indicated in FIG. 5. In this case, the inspection is performed as in the prior art as shown in FIG. 1, with the exception that the preferentially-etched side walls of the structure provide an unambiguous identification of the location of the side walls of the feature, e.g., for subsequent processing by the image-processing algorithm of the instrument to be calibrated. Further, because the patterned conductors 26 are disposed on insulative layer 22, according to the invention, such reflected-light measurements can be cross-calibrated with respect to electrical measurements; this was not possible using the Hatsuzawa structure, as noted above.

Removal of the portion 30 of the substrate 28 beneath the patterned conductor 26 is not required for performance of reflected-light measurements, and is also not necessary to perform current-forcing electrical measurements as discussed below in connection with FIG. 8. However, an embodiment of the test structure of the invention having had portion 30 of the substrate removed is useful in connection with certain additional electrical measurement techniques, as shown in FIG. 7. FIG. 7 illustrates schematically two different measurement techniques which could theoretically be used simultaneously in a single test arrangement, as shown, although in practice this would normally be unnecessarily complicated.

In FIG. 7, a scanning probe microscope (SPM) indicated generally at 40 is provided. A potential difference indicated at 42 is provided between a probe 44 having an atomically-sharp tip, and the patterned conductors 26. When the probe 44 is brought sufficiently close to the patterned conductors 26, a tunneling current flows therebetween. The rate of tunneling current flow is sufficiently sensitive to the surface characteristics of the patterned conductors 26 that individual atomic sites thereon can be identified and counted by appropriate analysis of variation of the tunneling current as the test structure is moved past the probe, as indicated by arrow 52. According to the invention, measurements of the width of patterned conductors 26, their spacing, and further geometrical characteristics made using the scanning probe microscope 40 can be correlated according to the invention with similar measurements made using other techniques.

One such technique involves capacitative measurement of the width of the conductors. As also shown in FIG. 7, a signal source 49 and a capacitance meter 50 can be connected between the patterned conductors 26 and metal films 45 on the rear of insulative layer 22; in this arrangement, insulative layer 22 constitutes a dielectric, so that a capacitance signal varying with the width of the patterned conductors 26 can be detected by capacitance meter 50.

Figure 3:
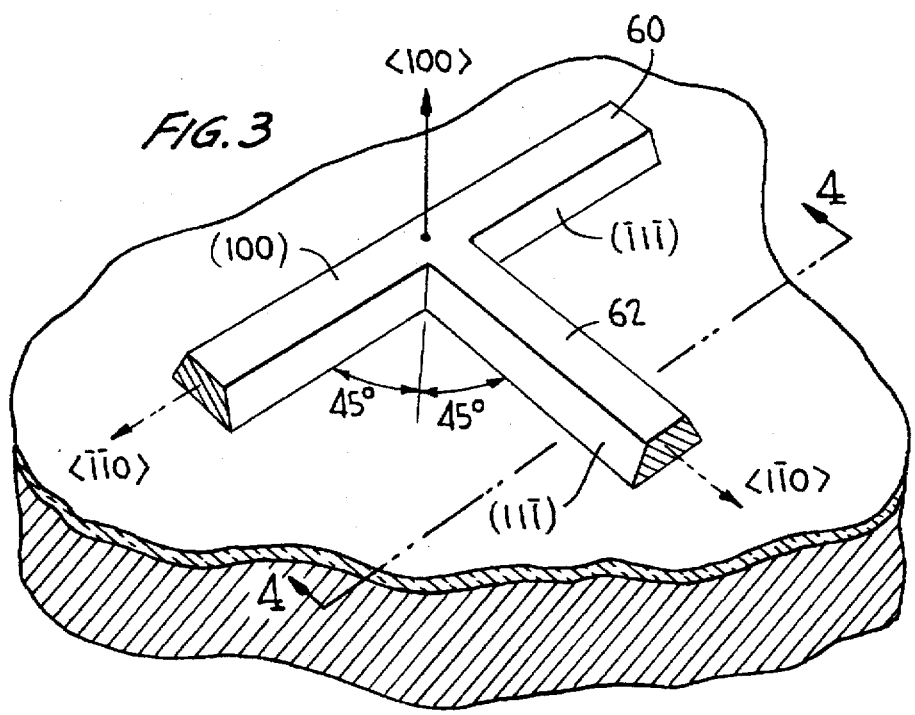
FIG. 3 shows a perspective view of an intersection between two conductors formed on a substrate according to a second embodiment of the present invention.
Figure 4:
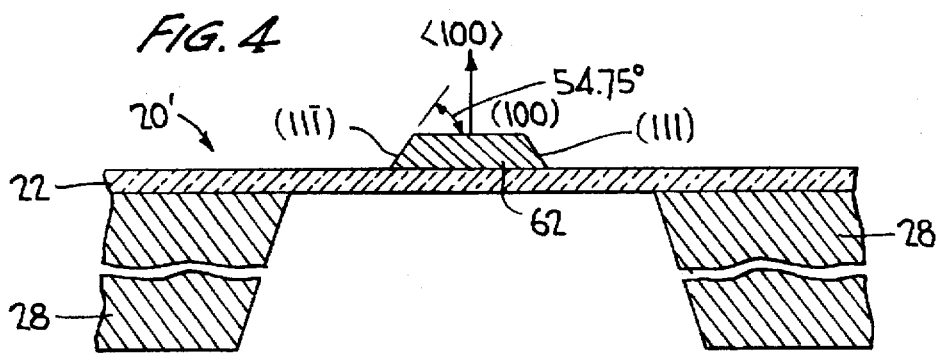
FIG. 4 shows a cross-sectional view along line 4—4 of FIG. 3.

Returning now to discussion of FIGS. 3 and 4, FIG. 3 shows a perspective view of a portion of a patterned test structure formed according to the invention, while FIG. 4 shows a cross-section of one conductor of the structure, taken along line 4—4 of FIG. 3. As indicated above, it is well known in the art that monocrystalline silicon material can be processed so as to be preferentially etched with respect to the crystal planes. Depending on the orientation of the monocrystalline starting material, that is, depending on the orientation of the upper surface exposed to the etchant, conductors formed on a substrate may have vertical side walls, as indicated in FIG. 2, or may form an angle of 54.75° to the plane of the substrate, as indicated in FIG. 4. As discussed below in connection with FIG. 8, it is convenient in connection with current-forcing electrical measurements to form a patterned structure comprising an elongated bridge conductor intersected by a number of taps. The taps are preferably similarly formed along preferential etching planes, such that the taps intersect the bridge conductor at angles similarly depending on the crystal orientation; this angle may be 90°, as shown in FIG. 3, or may be different, as shown in FIG. 8.

More specifically, as shown in FIGS. 3 and 4, when the orientation of the monocrystalline material is such that the <100> direction of the crystal is up, that is, perpendicular to the surface, the side walls of the patterned conductors form an angle of 54.75° with respect to the substrate, as shown in FIG. 4, while taps 62 will intersect an elongated conductor 60 aligned along the <1̄1̄0> direction at 90°; that is, the taps will lie along the <1̄10> direction, as shown in FIG. 3. (As above, the notation used herein and on the drawings to describe the orientation of the crystal planes of the test structures of the invention is conventional in the art.) By comparison, if the crystal is oriented with the <110> direction perpendicular to the substrate, as indicated in FIG. 2, the side walls of the patterned conductors 26 will be at 90° to the substrate, but taps 64 intersect an elongated bridge conductor 66 at angles of 109.48°, as indicated in FIG. 8.

Figure 8:
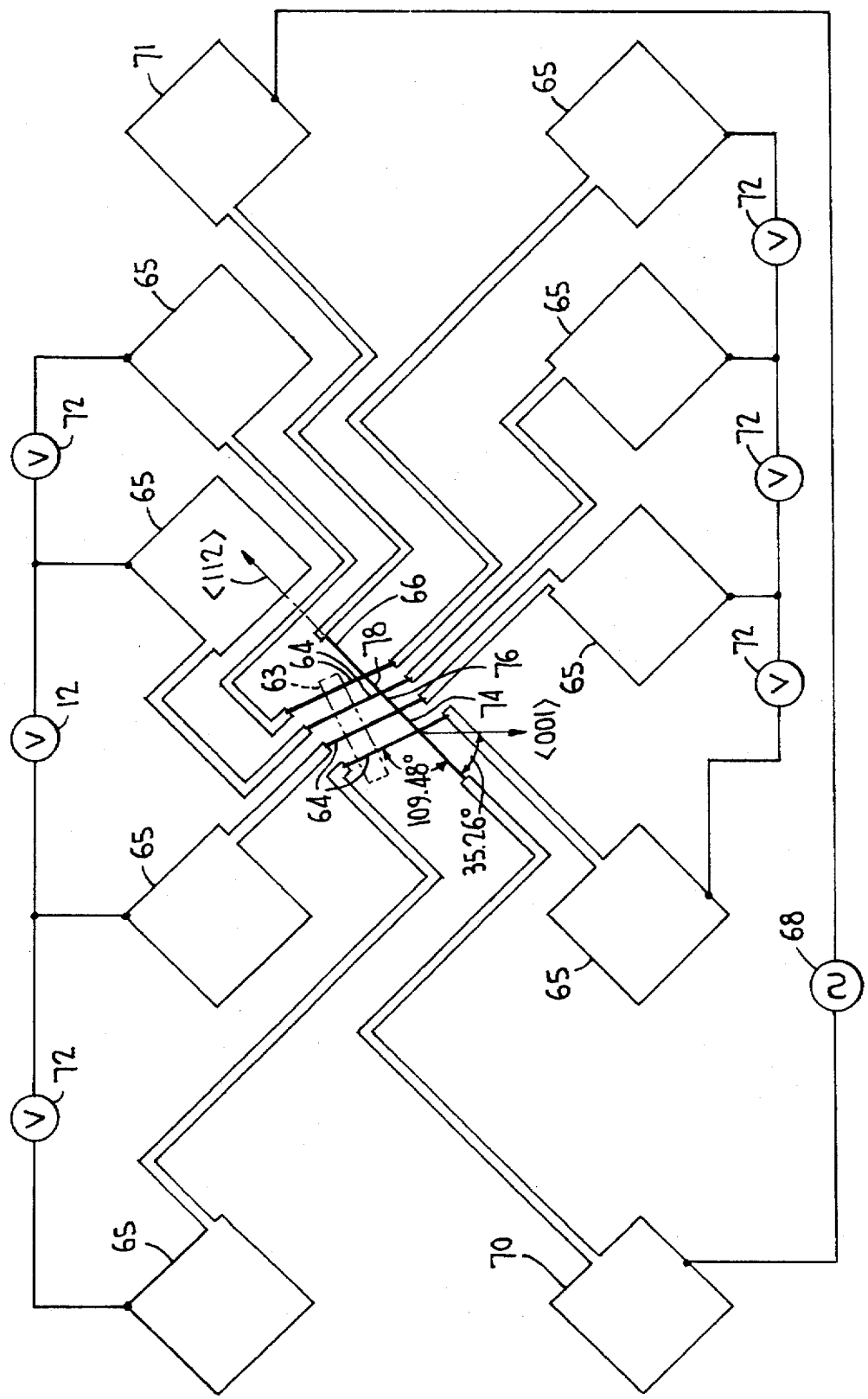
FIG. 8 shows a plan view of and a schematic arrangement for measuring geometrical characteristics of test structures according to the invention, using current-forcing electrical techniques.

FIG. 8 shows a plan view of one embodiment of a test structure according to the present invention, and also shows connections useful in practice of current-forcing electrical measurement methods disclosed in the parent and grandparent applications. The same structures, or equivalents thereto corresponding to the crystal orientation of FIGS. 3 and 4, may be used for these and other types of electrical measurements as discussed herein. As indicated, such test structures are designed for electrical measurements of the geometrical characteristics of the structure formed. For example, a current from a source indicated at 68 is forced between pads 70, 71 at either end of an elongated bridge conductor 66. Voltages may be measured as indicated at 72 between specified points therealong, e.g., by connections to pads 65 connected to taps 64, as indicated at 72, to determine the resistance of individual segments, e.g., 74, 76, 78, of conductor 66. Such measurements may be employed as disclosed in the predecessor applications.

According to the present invention, such current-forcing measurements of geometrical characteristics of the test structure formed from the monocrystalline material can then be cross-correlated to optical measurements, e.g., made as shown in FIGS. 5 or 6. Capacitative, SPM, or other measurements, made as shown in FIG. 7, can also be correlated to one another or to other types of measurement. In particular, the taps 64 may be aligned parallel to one another, defining a conventional "frame-in-frame" structure 63 as conventionally used for optical measurements. Such cross-correlation of various instruments can specifically be used to evaluate measurements of overlay as measured by the differing instruments.

It will be appreciated that according to the invention, very precise test structures can be formed by virtue of the fact that certain monocrystalline materials, notably monocrystalline silicon, are preferentially etched along the several crystalline planes by appropriate etching processes. More particularly, structures having precisely defined cross-sectional shapes may be formed on insulative substrates according to the invention, to enable electrical measurements thereof. Still more particularly, if the insulative layer is a silicon dioxide glass, the substrate beneath the insulative layer may be removed to enable transmissive-optical measurement of the geometrical characteristics of the conductors. Removal of the substrate beneath the insulative layer also allows electrical measurements requiring access to both sides of the insulative layer, e.g., capacitative measurements, to be performed.

Techniques for formation of an insulative layer within a monocrystalline silicon wafer so as to form a test structure precursor 20 to be patterned to form a test structure, as shown in FIG. 2, techniques for annealing the insulative layer to form a radiation-transmissive glass layer, and techniques used to pattern the monocrystalline layer remaining above the insulative layer, are generally within the skill of the art. As presently contemplated, silicon substrates having surfaces with the <100> or <110> orientations outward are of primary interest for practice of the invention; by comparison, most conventional semiconductors are fabricated from <111> material.

Reactive ion etching processes or KOH etching (or a combination of both) carried out with respect to the <110> material produces lines having a 90° side wall slope with respect to the wafer surface, that is, as shown in FIG. 2; where it is necessary to form taps 64 connected to an elongated conductor 66, as shown in FIG. 8, the masks used should be such that the taps meet the pads at the angle of 109.48°, as shown. Anisotropic KOH etching of <100> material can be used to produce conductors having a 54.75° sidewall slope relative to the wafer surface as shown in FIGS. 3 and 4, and having taps orthogonal to an elongated conductor. The selection between these possibilities, the detailed design of the patterned conductors, and the selection of other relevant processing parameters and the like, are considered to be within the skill of the art.

While several preferred embodiments of the invention have been described, and several distinct methods for its use have been disclosed, it will be appreciated that there are numerous additional modifications and improvements within the scope of the invention. In particular, it should be recognized that the invention may be usefully practiced with monocrystalline materials other than silicon. Further, it will be understood by those of skill in the art that the relative orientation of the various crystalline planes specified herein are but single examples of equivalent relative orientations that might have been specified. Therefore, the invention should not be limited by the above exemplary disclosure, but only by the following claims, and the claims should be interpreted to include all equivalents to the recitations found explicitly therein.

We claim:

1. A test structure for calibrating instruments for measuring geometrical characteristics of features formed on a substrate, comprising:

an insulative layer; and a monocrystalline layer of a conductive material exhibiting preferential etching, such that said material is removed preferentially along certain crystal orientations, when processed according to a predetermined etching process, formed on said insulative layer;

said monocrystalline layer having been processed by preferential etching to define a pattern selected to permit evaluation of said geometrical characteristics of features formed therein, wherein said pattern formed in said monocrystalline layer defines an elongated conductor having a plurality of taps connected thereto, to enable measurement of the width of said elongated conductor by passing a current therethrough and measuring voltage drops therealong.

2. The test structure of claim 1, wherein the crystal orientation of said monocrystalline layer relative to the surface of said monocrystalline layer and said etching process are cooperatively selected, such that a pattern comprising one or more elongated conductive members having flat upper surfaces and substantially planar side walls inclined at a predetermined angle to the vertical is formed by preferential etching.

3. The test structure of claim 2, wherein said monocrystalline material is silicon, and said etching process employs an etchant selected from the group including KOH and NaOH.

4. The test structure of claim 1, further comprising a monocrystalline conductive substrate of said material exhibiting preferential etching, within which said insulative layer is formed.

5. The test structure of claim 4, wherein said insulative layer is formed within said monocrystalline conductive substrate without disturbing the monocrystalline surface thereof, such that said patterned monocrystalline layer formed on said insulative layer is integral with said monocrystalline conductive substrate, with said insulative layer disposed therebetween.

6. The test structure of claim 5, wherein said insulative layer is formed by implantation of oxygen atoms into said monocrystalline silicon substrate, followed by annealing, such that an insulative layer of $SiO_2$ is formed in situ.

7. The test structure of claim 6, wherein a portion of said substrate beneath said pattern formed in said monocrystalline layer is removed, enabling transmissive optical inspection of said pattern through said $SiO_2$ insulative layer.

8. The test structure of claim 1, wherein the angles at which said taps intersect said elongated conductor correspond to the angles at which substantially planar side walls of said conductor are inclined with respect to a flat upper surface of said conductor.

9. The test structure of claim 8, wherein said silicon monocrystalline layer has an <110> upper surface, the direction of elongation of said elongated conductor is <112>, said side walls are oriented at 90° with respect to said flat upper surfaces of said conductor, and said taps intersect said elongated conductor at angles substantially equal to 109.48°.

10. The test structure of claim 8, wherein said silicon monocrystalline layer has an <100> upper surface, the direction of elongation of said elongated conductor is <110>, said side walls are oriented at substantially 54.75° with respect to said flat upper surfaces of said conductor, and said taps intersect said elongated conductor at angles substantially equal to 90°.

* * * * *